United States Patent [19]

Shirley

[11] Patent Number: 4,616,349
[45] Date of Patent: Oct. 7, 1986

[54] ANALOG-TO-DIGITAL CONVERTER FOR SEISMIC EXPLORATION USING DELTA MODULATION

[75] Inventor: Thomas E. Shirley, Richardson, Tex.

[73] Assignee: Mobil Oil Corporation, New York, N.Y.

[21] Appl. No.: 443,504

[22] Filed: Nov. 22, 1982

[51] Int. Cl.[4] ............... G01V 1/24; H03K 13/01
[52] U.S. Cl. ........................... 367/66; 367/21; 367/60; 375/27; 375/30; 340/347 M
[58] Field of Search ........... 367/20, 21, 60, 66, 367/45, 73; 340/347 AD, 347 M; 375/30, 29, 28, 27; 332/11 D; 364/421

[56] References Cited

U.S. PATENT DOCUMENTS

| | | | |
|---|---|---|---|
| 3,918,042 | 11/1975 | Werner | 340/347 AD |
| 3,980,953 | 9/1976 | Hance et al. | 375/29 |
| 4,008,435 | 2/1977 | Oshima et al. | 375/28 |
| 4,071,825 | 1/1978 | McGuffin | 375/29 |
| 4,107,669 | 8/1978 | Tewhsbury | 375/27 |
| 4,229,820 | 10/1980 | Enomoto . | |
| 4,318,086 | 3/1982 | Peek et al. | 340/347 AD |
| 4,371,972 | 2/1983 | Schwarz et al. | 375/30 |
| 4,411,001 | 10/1983 | Van Buul et al. . | |
| 4,446,565 | 5/1984 | Backof, Jr. | 332/11 D |
| 4,468,790 | 8/1984 | Hofelt | 375/30 |
| 4,509,150 | 4/1985 | Davis | 367/76 |

FOREIGN PATENT DOCUMENTS

| | | |
|---|---|---|
| 0021650 | 4/1980 | European Pat. Off. . |
| 2088660 | 10/1981 | United Kingdom . |
| 558236 | 7/1977 | U.S.S.R. . |

Primary Examiner—Nelson Moskowitz
Attorney, Agent, or Firm—Alexander J. McKillop; Michael G. Gilman; Charles J. Speciale

[57] ABSTRACT

An analog-to-digital converter for use in seismic data processing applications is disclosed which features variants on delta modulation and delta-sigma modulation methods. A series of single bits is output by an analog-to-digital converter based on comparison of a predicted analog signal with the actual analog signal. A low pass filter and subsampling operation is applied to the output digital bits to provide digital words corresponding to the analog signal amplitude. Plural integrator stages are shown which allow reduction of quantization error.

13 Claims, 5 Drawing Figures

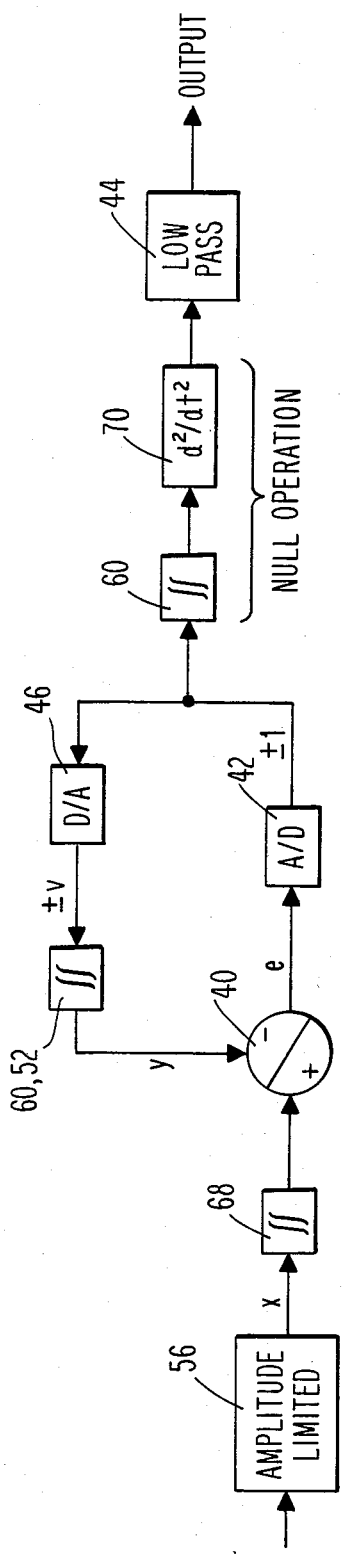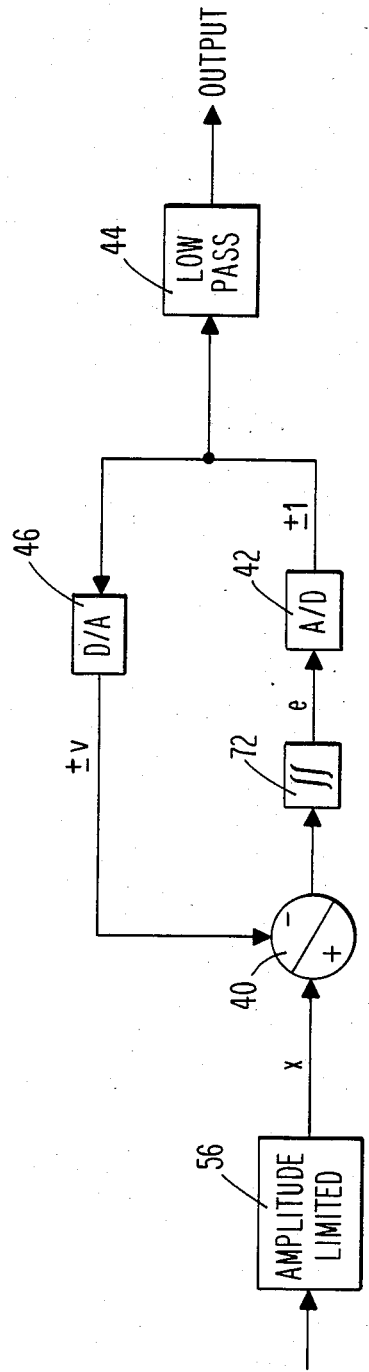
Fig. 4A
Fig. 4B

ANALOG-TO-DIGITAL CONVERTER FOR SEISMIC EXPLORATION USING DELTA MODULATION

FIELD OF THE INVENTION

This invention relates to devices for conversion of analog signals generated during seismic exploration for valuable minerals to digital format for data processing. In particular, the invention relates to circuitry for analog-to-digital conversion using delta and delta/sigma modulation techniques specifically optimized for seismic exploration applications to improve the signal-to-noise ratio of the recorded digital signals.

BACKGROUND OF THE INVENTION

For many years it has been common to explore for oil, gas and other valuable minerals by use of seismic techniques. These involve imparting a wave to the earth by, for example, detonating a "shot" of dynamite on the earth's surface or by simply imparting a mechanical vibration to the earth. The wave travels into the earth and is reflected from interfaces separating varying rock layers in the earth's subsurface formation. Detectors spaced some distance from the point at which the seismic energy is imparted to the earth output analog signals upon receipt of the reflected waves. By measuring the time taken by the signal to travel over plural paths to plural detectors, conclusions can be reached about the shape of the interfaces. From analysis of these interfaces, likely locations for deposits of oil, gas and other valuable minerals can be identified.

A perennial problem in the accurate measurement of the time taken by the waves in transit is the recordation of the signals with a sufficiently good signal-to-noise ratio to enable the received signals to be reliably distinguished from noise occurring in the earth and generated by the exploration process itself. In particular, when marine seismic exploration is performed, acoustic microphones, referred to herinafter as "hydrophones", are trailed behind a seismic exploration vessel. The vessel includes means for imparting an acoustic wave to the ocean, which then travels through the ocean and into the sea bed. The wave is reflected from the interfaces between the rock layers forming the sea bed and returns to the detectors streamed behind the exploration vessel. The motion of the "streamer" cable and hydrophones adds substantial noise to the signal. Signal degradation also occurs during transmission of the signals from the hydrophones up the streamer cable to the exploration vessel for recording. The signals are typically converted to digital format for recording; any distortion in the analog signal path or inaccuracy in digitization can be considered "noise." It would obviously be desirable to improve the signal-to-noise ratio of such marine seismic explorations by any means possible so as to allow better identification of geologically significant events in the seismic record.

Presently available analog-to-digital converters are not as advanced as are the data processing methods being used —i.e., the art can decidedly benefit from improved analog-to-digital conversion means. Presently the state of the art in seismic data processing is capable of meaningful analysis of signals of up to approximately 120 dB level difference. The present invention is designed to approach more closely to such sensitivity in encoding analog signals. In particular, the invention is designed to provide more accurate digitization of analog input signals, thus reducing "quantization noise" while eliminating distortion-producing analog circuit components from the signal path. One popular device now in use in analog-to-digital conversion in seismic applications is a gain-ranging amplifier; this shows good dynamic range (sensitivity to a wide range of input signal amplitudes) but poor resolution (insensitivity to small signals superimposed on larger ones). The poor resolution is partly due to serious non-linear distortion in the gain-ranging amplifier.

OBJECTS OF THE INVENTION

Accordingly, it is an object of the invention to provide an improved analog-to-digital converter for seismic exploration.

It is an object of the invention to provide an analog-to-digital converter which avoids use of distortion producing analog circuit elements such as gain-ranging amplifiers.

It is a further object of the invention to provide a digital-to-analog converter having higher resolution and improved dynamic range than any previously made available for seismic exploration.

It is a further object of the invention to provide an analog-to-digital converter which is optimized for the seismic environment so as to turn to advantage the unique characteristics of the band-limited signals typically of interest in the seismic exploration process.

It is an ultimate object of the invention to provide an improved method of seismic exploration, particularly one in which seismic signals having a higher signal-to-noise ratio than previously available are made available to those analyzing the seismic data.

SUMMARY OF THE INVENTION

The above mentioned needs of the art and objects of the invention are satisfied by the present invention which comprises an analog-to-digital converter suitable for use in seismic exploration data processing applications. The analog-to-digital converter of the invention uses delta modulation or delta-sigma modulation techniques with one or more integration stages. Multiple integration stages may be added to improve the resolution and dynamic range simultaneously.

BRIEF DESCRIPTION OF THE DRAWINGS

The invention will be better understood by reference to the accompanying drawings, in which:

FIG. 4 comprising FIGS. 4A and 4B, show respectively expanded and compact double integration delta-sigma modulation circuitry for analog-to-digital conversion.

DESCRIPTION OF THE PREFERRED EMBODIMENTS

Figure 1:
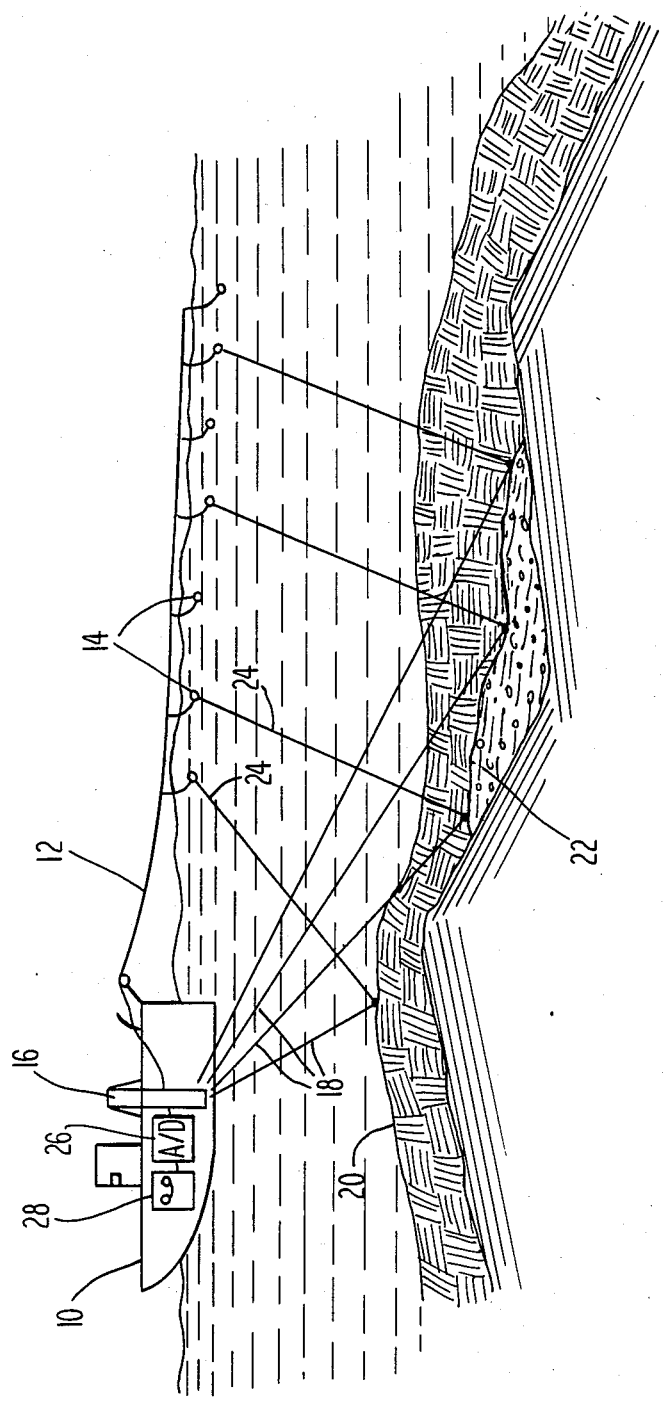
FIG. 1 shows a seismic exploration system within which the analog-to-digital converter of the invention would find application.

FIG. 1 shows a marine seismic exploration system within which the present invention is useful. An exploration vessel 10 tows a streamer cable 12 behind it, which comprises a plurality of hydrophones 14. A source of seismic energy 16 on the vessel, which may be a compressed air gun or the like, transmits seismic energy down various ray paths 18 to be reflected at the ocean bottom 20 or from an interface 22 between varying rock layers of the sub-sea bed and reflected back upwardly along differing ray paths 24 to be received by hydrophones 14. The analog signals received by the hydrophones 14 are converted into digital signals by analog-to-digital conversion means according to the invention 26 prior to recording on recording device 28. As noted, no prior art device of which the inventor is aware is ideal for analog-to-digital conversion with sufficient dynamic range and resolution for seismic exploration purposes. The present invention addresses and provides a better solution to this problem.

Figure 2:
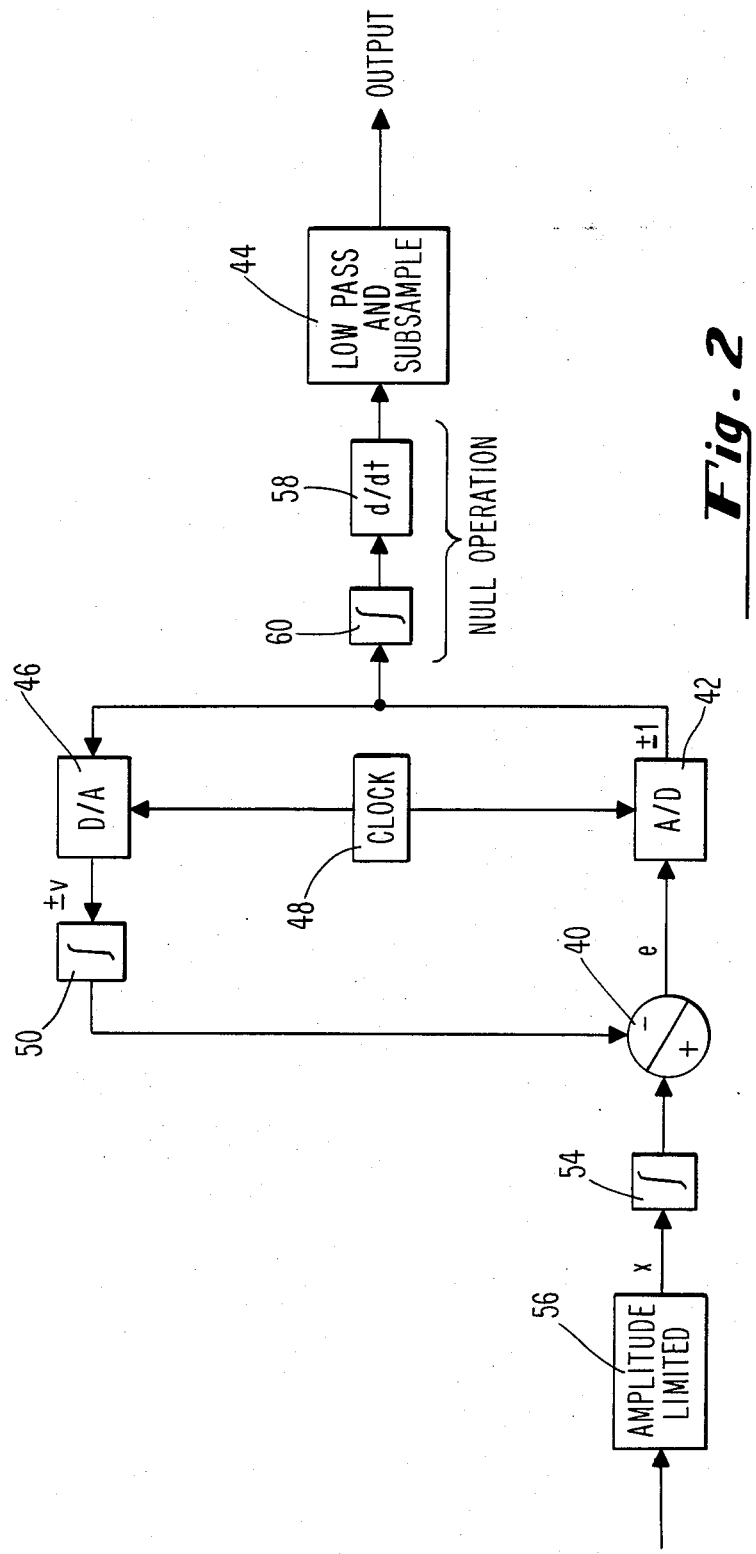
FIG. 2 shows a basic delta-sigma modulator circuit for analog-to-digital conversion.

As discussed above, the present invention utilizes delta modulation techniques including delta-sigma modulation to achieve accurate encoding of seismic data signals. Delta modulation per se is a well-known technique which may be referred to generically as outputting a single bit representative of the direction of change of an analog signal upon each sampling of the signal. See, generally, Baldwin et al, "Linear Delta Modulator Integrated Circuit with 17-Mbit/sec Sampling Rate", IEEE Trans. on Comm., Vol. Com-22, No. 7, pp. 977-985 (1974). Thus, for example, as long as the analog signal keeps increasing, a series of digital "ones" is output; if the signal decreases, "zeroes" are output. Such a method can yield accurate encoding results, if the sampling rate is sufficiently high compared with the bandwidth of the input signal. However, in the seismic application, it is desired to obtain individual digital words representative of the instantaneous amplitude of the analog signal, and hence a stream of ones and zeroes would not in itself be useful. Because of the inherent simplicity of the delta modulation technique, however, it is still desirably applied to the seismic system. FIG. 2 shows how this can be achieved.

The block diagram circuit shown in FIG. 2 shows numerous elements not all of which are necessary to functioning circuitry. Accordingly, the circuit will be first described in a first relatively simple mode of operation. Further description will explain the other elements shown for more refined circuit operation.

Thus, in the simplest case, an input signal X is supplied to a differencing junction 40. At this time, it is compared with an analog estimate signal and an error signal e is output. This is converted by an analog-to-digital converter 42 to a series of single bits, each representative of the sign of e. The converter 42 may therefore be a simple comparator outputting ±1 depending on whether the estimated signal is greater or lesser than the actual input signal at the time of comparison. This string of +1's and −1's becomes the output of the system. This output can be decoded in an inverse operation if it is desired to regenerate the analog signals for, e.g., seismic analysis. Alternatively, digital words can be output, representative of the instantaneous amplitude of the signal, by a low pass filter and subsampling unit 44, if this is preferred; this is further explained below.

The string of ±1's is also supplied to a one-bit digital-to-analog converter 46, the operation of which is synchronized to the operation of the analog-to-digital converter 42 by a clock 48. The digital-to-analog converter 46 outputs a voltage ±V based on the digital ±1 supplied to it from the analog-to-digital converter 42. The ±V voltages are summed in an integrator stage 50 which may comprise a simple capacitor, which in turn supplies the analog estimate to the differencing junction 40 for comparison with the successive input signals. In this way, the predicted signal is continually updated to match the actual input signal by constantly being supplied with ±V from the digital-to-analog converter 46.

According to this delta modulation loop, therefore, a continuous stream of ±1's is output indicating the direction of change of the signal. These in turn control the addition or subtraction of additional unit quantities to the analog estimate signal, which is compared with the input signal at successive clock cycle times. Accordingly, if the sampling rate, controlled by the clock 48, times the unit voltage ±V output by the digital-to-analog converter 46 to update the estimated value, is at least equal to the maximum rate of change of the input signal, the delta modulator circuit will track the input signal with reasonable accuracy.

Typically, the output of the circuit will be passed to an integrator 60, and a low pass filter and subsampling unit 44. Theses units are well known in the art, See, for example Rabiner and Gold "Theory and Application of Digital Signal Processing" Prentice Hall (1975). The integrator 60 sums a plurality of the output ±1's. At intervals determined by the desired output sample rate, e.g., the Nyquist frequency, the output of the low pass filter 44 is subsampled, i.e., a digital word representing the "running total" of the ±1's received since the last subsample was taken is output to, e.g., means for recording the digitized analog signal samples. In a preferred embodiment of the invention which was computer simulated, the seismic signals of interest had a maximum frequency of 125 Hz so that the Nyquist frequency was 250 Hz. The clock 48 operated at a rate of 60 kHz and the signal-to-noise ratio of the encoded signals was on the order of 50 dB. Higher clock rates will result in better performance.

As discussed above, the circuit of the invention contemplates use of modification to the delta modulator circuit described above including the version known as a delta-sigma modulator. According to this modification, an additional integrator stage 54 is added prior to the summing junction. This, together with an amplitude limiter or clipper 56, serves to limit the slope of the input signal thus avoiding any overrun caused by the rate of change of the input signal exceeding the clock rate times the unit output voltage output by the digital-to-analog converter 46. This expedient can result in improved signal-to-noise ratio. In order to ensure that the output signal is not distorted by the addition of integrator stage 54, differentiator state 58 is then added on the output side. However, since an integrator 60 is already present in the output stage, either separately as shown or as part of the low pass filter to provide a "memory" characteristic for the low pass filter, this integrator 60 and the differentiator 58 tend to simply cancel one another out and can both be eliminated simply in favor of the low pass filter and subsampling unit 44. Accordingly, all that needs to be added to the basic delta modulator to provide the "sigma" feature is the second integrator stage 54 in the input signal path.

Further improvements are possible in both delta modulators and delta-sigma modulators by, for example, adding additional integrator stages in the loop. These serve essentially to smooth the summation which yields the predicted value which provides a filtering effect to the input signal. In this connection it is important to recall that this invention relates to analog-to-digital converter for use with seismic signals having a bandwidth of only 0-125 Hz. By comparison, the clock rate in the simulation example discussed is 60 kHz or more, so that the circuitry is capable of processing a great deal more data than would be required to generate a series of digital words, using, for example, a single-chip analog-to-digital converter. According to the Nyquist formula only 250 words per second are required to accurately represent the signal. It is therefore entirely feasible to do a great deal of additional signal processing as shown in order to ensure that the comparatively few digital words output by the subsampler 44 are as accurately representative of the input signal as possible.

Figure 3:
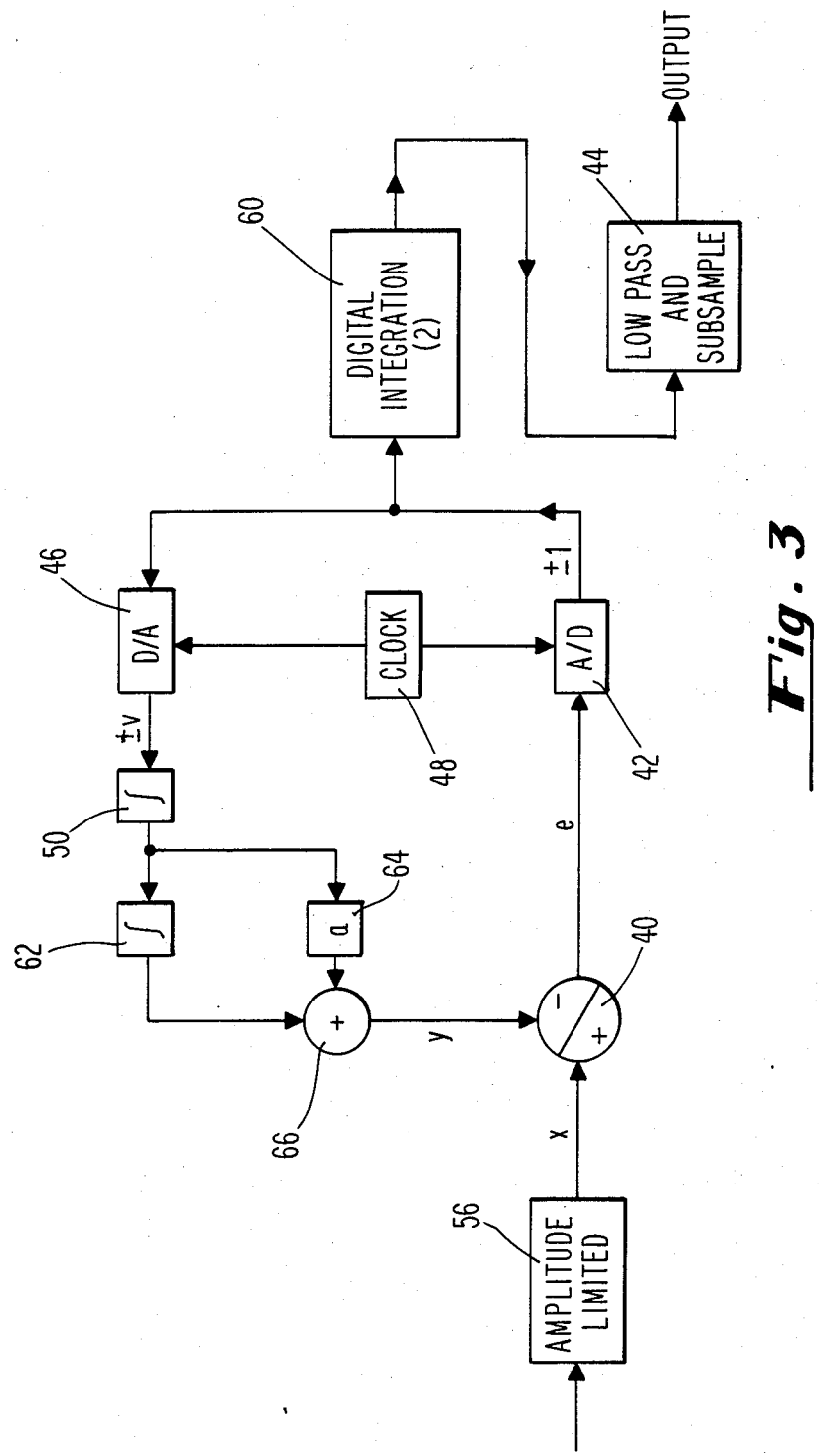
FIG. 3 shows a double integration delta modulation circuit for analog-to-digital conversion.

FIG. 3 shows an example of a double integration delta modulation circuit. The elements of the basic delta modulator loop, differencing junction 40, analog-to-digital converter 42, clock 48, digital-to-analog converter 46 and integrator 50 are the same as in the embodiment of the delta modulator discussed in connection with FIG. 2. A second integrator stage 62 is now added. Use of the double integration steps allow much better accuracy of the predicted signal supplied from the integrator 62 to the differencing junction 40. This results in a smaller error signal and thus further reduces noise by virtue of provision of more accurate error sampling and quantization. However, it can be shown that such a circuit without more will be unstable because the improved response of the double integrator system will cause overshoot of the predicted signal. Accordingly, a "lead" element 64 is added and the signal output by the lead element 64 is combined with that output by the second integrator stage 62 in a second summing junction 66. The lead element multiplies the output of the first integrator stage 50 by a set factor which can be determined by experiment or by simulation so as to artificially increase the predicted sample compared with the actual input signal in differencing junction 40. In a simulated test of this circuit, the factor by which the signal output by integrator 50 was multiplied in lead element 64 was 2. In this way, a "leading" characteristic is provided, so that the predicted signal Y equals the input signal before the output of integrator 50 equals the input signal, so as to provide a damping effect to the double integration loop. A second integrator stage is also added on the output side at 60, while the clipper 56 may desirably be used, as discussed above in connection with FIG. 2.

FIG. 4 shows two versions of a double integrator delta-sigma modulation circuit. FIG. 4A shows a delta-sigma modulator, so called because double integrators are added at 68 on the input side of differencing junction 40. Double differentiators are added on the output side at 70 which combine with the double integrators 60 in a null operation so these can be removed. The stabilization provided by lead element 64 and summing junction 66 discussed above in connection with FIG. 3 is not shown, for clarity, but would also be required. It has also been realized by the present inventor that the four integrator stages 68 and 60,52 of FIG. 4A can be combined in a single double integrator stage 72 to yield the circuit shown in FIG. 4B, a highly compact, double integration delta-sigma modulator circuit.

The circuit shown in FIG. 3 has been simulated by computer test and results indicate that signal-to-noise ratios of over 100 dB should be possible with circuits of the class described using sampling rates of 60 kHz or more to quantize seismic signals band limited to 0–125 Hz. Such performance would be very useful in the seismic environment.

Accordingly, it will be appreciated by those skilled in the art that there has been described an analog-to-digital converter for use in seismic data processing applications, and that the preferred embodiments described above should not be considered as a limitation on the scope of the invention, but merely as exemplary thereof.

I claim:

1. A seismic exploration system comprising:
   means for imparting seismic energy to the earth;
   means for detecting return of said seismic energy after reflection within the earth, said means for detecting comprising means for supplying an analog electronic signal as input to analog-to-digital converter means;
   analog-to-digital converter means for converting said input analog signal to a digital signal for convenience in signal transmission and storage, said analog-to-digital converter means comprising:
   means for generating a series of predicted analog signal values:
   means for comparing said series of predicted values to a series of instantaneous values of said input analog signal;
   means for outputting a series of single digital bits each indicative of whether one of the predicted analog values is greater or lesser than the corresponding instantaneous value;
   means for updating said predicted value based on said series of digital bits;
   means for integrating said input analog signal prior to being supplied to said means for comparison;
   means for amplitude limiting the input analog signal prior to supply of said signal to said means for integrating said input analog signal; and
   low pass filter means and subsampling means connected to said means for outputting a series of digital bits for outputting a digital word representative of the instantaneous value of said analog input signal at selected sampling times, said series of single digital bits being applied to said integrator means prior to said low pass filter means and subsampling means.

2. The system of claim 1 wherein said means for generating a series of predicted values is digital-to-analog converter means for outputting a unit analog voltage based on said series of digital bits, and integrator means for summing said unit voltages.

3. The apparatus of claim 2 where said integrator means for summing said unit voltages comprises plural integrator stages serially connected to one another.

4. The system of claim 3 further comprising means for damping the rate of change of the output of said serially-connected integrator stages when the predicted value approaches the input signal value.

5. The system of claim 1 further comprising integrator means, low pass filter means and subsampling means connected to said means for outputting a series of digital bits for outputting a digital word representative of the instantaneous value of said analog input signal at selected sampling times.

6. An analog-to-digital converter for converting a series of analog seismic input signal samples into digital representations thereof comprising:
   means for generating a series of predicted analog signal values;
   means for comparing said predicted analog signal values to said analog seismic input signal samples;

means responsive to said means for comparing for outputting a series of single bits, each of said bits indicative of whether the predicted analog signal value at a given point in time is greater or lesser than the corresponding instantaneous actual analog input signal sample;

means connected to said means for generating for updating said predicted analog signal values based on each of said digital bits;

integrator means for integrating the input analog signal prior to supply of the input signal to said means for comparing of the analog input signal with said predicted analog signal; and means for amplitude limiting the input signal prior to supply of said integrator means.

7. The converter of claim 6 further comprising low pass filtering and subsampling means for generating digital words corresponding to the instantaneous analog value of said signal at predetermined sampling times.

8. The converter of claim 7 wherein said digital words are generated at a frequency much lower than the frequency of comparison of said predicted and actual analog signals.

9. The converter of claim 6 wherein said means for generating the predicted analog input signal is digital-to-analog converter means adapted to add or subtract a unit voltage from the previous predicted value of said predicted signal, dependent on individual ones of the digital bits output by said analog-to-digital converter means.

10. The converter of claim 6 wherein said means for generating a predicted analog signal is integrator means for outputting an analog value in response to said series of single bits.

11. The converter of claim 10 wherein a unit voltage is added to or subtracted from a voltage stored in said integrator means in response to each one of said series of bits.

12. The converter of claim 11 wherein said integrator means comprises plural serially connected integrators.

13. The converter of claims of 1 or 6 wherein said means for integrating said input analog signal comprises a double integrator.

* * * * *